United States Patent [19]

Hara et al.

[11] Patent Number: 5,446,418
[45] Date of Patent: Aug. 29, 1995

[54] RING OSCILLATOR AND CONSTANT VOLTAGE GENERATION CIRCUIT

[75] Inventors: Motoko Hara; Takeshi Kajimoto, both of Hyogo, Japan

[73] Assignee: Mitsubishi Denki Kabushiki Kaisha, Tokyo, Japan

[21] Appl. No.: 147,268

[22] Filed: Nov. 5, 1993

[30] Foreign Application Priority Data

Nov. 6, 1992 [JP] Japan .................................. 4-296945

[51] Int. Cl.6 ......................................... H03K 3/353
[52] U.S. Cl. .................... 331/57; 331/108 B; 365/189.09
[58] Field of Search ............... 331/57, 108 B, 135, 331/46, 49; 365/189.06, 189.07, 189.09; 327/535, 536, 537, 538, 540, 545

[56] References Cited

U.S. PATENT DOCUMENTS

| | | | |
|---|---|---|---|
| 4,536,720 | 8/1985 | Cranford, Jr. et al. | 331/57 |
| 4,853,654 | 8/1989 | Sakurai | 331/57 |
| 4,891,609 | 1/1990 | Eilley | 331/108 B |

FOREIGN PATENT DOCUMENTS

| | | |
|---|---|---|
| 0383549A2 | 8/1990 | European Pat. Off. . |
| 3001428A1 | 7/1980 | Germany . |
| 3042323C2 | 6/1981 | Germany . |
| 3321553A1 | 12/1983 | Germany . |
| 61-147614 | 7/1986 | Japan . |
| 3-259619 | 11/1991 | Japan . |

*Primary Examiner*—Robert J. Pascal
*Assistant Examiner*—David Vu
*Attorney, Agent, or Firm*—Lowe, Price, LeBlanc & Becker

[57] ABSTRACT

A ring oscillator according to the invention includes a plurality of inverters cascade-connected between an input node and an output node. Each inverter includes four transistors connected in series between a power supply node and a ground node. A first pair of transistors each have a channel sized to have an input capacitance for delaying the signal of a preceding stage inverter for a prescribed time period. A second pair of transistors are coupled to a current mirror circuit and limits current flowing through the first pair of transistors. Thus, power consumption for obtaining a signal in a prescribed cycle is reduced.

5 Claims, 17 Drawing Sheets

RING OSCILLATOR AND CONSTANT VOLTAGE GENERATION CIRCUIT

BACKGROUND OF THE INVENTION

1. Field of the Invention

The present invention relates to a ring oscillator having a plurality of cascade-connected inverters for generating an output signal of a prescribed cycle by feeding back a signal on an output terminal to an input terminal, and a constant voltage generation circuit incorporating such a ring oscillator.

2. Description of the Background Art

FIG. 15 is a circuit diagram showing a conventional ring oscillator. Referring to FIG. 15, the ring oscillator includes inverters 15, 25, 35, 45, and 55. First stage inverter 15 has its input node connected to the output node of final stage inverter 55, and its output node connected to the input node of second stage inverter 25. The second to fourth stage inverters each have an input node connected to the output node of a preceding stage inverter, and an output node connected to the input node of a succeeding stage inverter.

Although in FIG. 15 the number of stages of the inverters is five, odd-number stages, at least three stages may be provided.

Operation of the ring oscillator in FIG. 15 will be described. When an input signal is input to inverter 15, an output signal OUT which is the inverse of input signal IN is output from final stage inverter 55. Output signal OUT is fed back to the input node of first stage inverter 15, so that output signal OUT becomes a signal inverted in a fixed cycle T as illustrated in FIG. 16.

Now, a description follows in conjunction with FIGS. 17A and 17B on how an oscillation cycle for the ring oscillator is determined. FIG. 17A is a circuit diagram showing in detail first stage inverter 15 and second stage inverter 25 in the ring oscillator in FIG. 15. FIG. 17B is a plan view showing a transistor forming each inverter in FIG. 17A.

Referring to FIGS. 17A and 17B, inverters 15 and 25 each include a PMOS transistor 1p and an NMOS transistor 1n connected in a complementary manner. PMOS transistor 1p and NMOS transistor 1n each have an ON resistance value R. Inverters 15 and 25 each have a capacitance C determined by the channel length L and channel width W of each of PMOS transistor 1p and NMOS transistor 1n.

The oscillation cycle T of the ring oscillator is the sum of time delays t of the inverters, and time delay t is represented as follows:

$$t \propto R \times C$$

$$R \propto L/W, \quad C \propto W \times L \quad (1)$$

$$t \propto L^2 \quad (2)$$

From expression (2), the time delay t of each inverter is determined by the channel length L of an MOS transistor. Accordingly, in order to prolong the cycle of the output signal, approaches such as (1) to increase the channel length, (2) increase the number of stages of inverters, and (3) to decrease the amount of current supply to the inverters can be considered.

However, increase of R (=L/W) decreases charge/discharge current to/from the gate, but increases C (=W×L) as well, and therefore charge/discharge current to/from the gate is conversely increased. Such increase of charge/discharge current increases power consumption by the semiconductor integrated circuit.

Accordingly, in order to reduce power consumption, two approaches, i.e. to increased R and to decrease C are considered.

For example, in order to set 200 ns for the cycle of the ring oscillator shown in FIG. 15, the channel width W/channel length L ratios of PMOS transistor 1p and NMOS transistor 1n are formed to be $\frac{1}{4}$, $\frac{1}{2}$, respectively. Meanwhile, in order to set 7.6μs for the cycle and 1.7μA for consumption current, as illustrated in FIG. 18, the W/L of PMOS transistor 1p and NMOS transistor 1n are formed to be 2/50, 2/100, respectively.

FIG. 19 is a circuit diagram showing a ring oscillator incorporated in a PLL circuit disclosed in Japanese Patent Laying-Open No. 3-259619. The ring oscillator serially changes the oscillation cycle by controlling the number of stages of inverters and the amount of current supply to the inverters.

Referring to FIG. 19, the ring oscillator includes a buffer 65, inverters 15–55, and a selector 7. Selector 7 selects the output of third stage inverter 35 or fifth stage inverter 55 in response to a control signal, and feeds back the output to first stage inverter 15. Inverters 15, 25, 35, 45, and 55 each includes PMOS transistors 11p and 12p, and NMOS transistors 11n and 12n connected in series between a power supply node and a ground node. PMOS transistor 11p and NMOS transistor 11n are turned on/off in a complementary manner in response to an input signal. PMOS transistor 12p and NMOS transistor 12n have their ON resistance values changed in response to the output of buffer 65.

In operation, the number of stages of inverters is selected in response to a control signal, and the oscillation cycle is changed. In response to a control voltage, buffer 65 controls the ON resistance values of PMOS transistor 12p and NMOS transistor 12n, and therefore the oscillation cycle can be changed.

In the ring oscillator shown in FIGS. 15–18, transistors with an increased channel length L are used when an output signal of a long cycle is generated, and therefore resistance value R increases, current flowing from the power supply terminal to the output node and current flowing from the output node to the ground node decrease, thus decreasing current consumption by the ring oscillator.

However, capacitance C increases, and therefore current consumption by the capacitor increases. A ring oscillator with such a large current consumption is not suitable for application to a circuit for generating backup voltage for a memory device, such as to a substrate bias voltage generation circuit.

Transistors 12p and 12n for current limiting shown in FIG. 19 are applied only for a PLL circuit device and used only for serially controlling the oscillation cycle. Accordingly, the oscillation frequency changes around a reference clock signal, and therefore the size of the ring oscillator mostly depends on the gate lengths L of transistors 11p and 11n for switching. Accordingly, in order to provide a ring oscillator with an oscillating cycle of 7.6μs and a current consumption of 1.91μA, for example, the gate lengths L of transistors 11p and 11n for switching must be the same as those shown in FIG. 18. Therefore, the current consumption by input capacitance C cannot be reduced.

FIG. 20 is a circuit diagram showing a ring oscillator for FM-modulating an analog input signal. The circuit is disclosed in Japanese Patent Laying-Open No. 61-147614 (laid open on Jul. 15, 1986).

The ring oscillator shown in FIG. 20 is different from the ring oscillator in FIG. 19 in that PMOSFET 12p and NMOSFET 12n control current in response to an analog input signal.

The circuit shown in FIG. 20 can provide a pulse signal having a frequency corresponding to the level of an analog input signal.

The longest cycle for the pulse signal is about at most ten times as long as the shortest cycle. Accordingly, in order to provide a ring oscillator having a large cycle (7.6μs) and current consumption of 1.91μA, the gate lengths L of transistors 11p and 11n for switching must be the same as those in FIG. 18. Therefore, current consumption due to input capacitance C cannot be reduced.

SUMMARY OF THE INVENTION

It is an object of the invention to restrain current consumption in a ring oscillator generating an output signal of a prescribed cycle.

Another object of the invention is to restrain current consumption in a constant voltage generation circuit using a ring oscillator.

Briefly stated, a ring oscillator according to the invention includes a plurality of inverters and a feedback interconnection. The plurality of inverters are cascade-connected between input and output nodes. Each inverter includes first and second transistors and a current limiting element. The first and second transistors each have a channel sized so as to have an input capacitance component for delaying the output signal of a preceding stage inverter for a prescribed time period, and are turned on/off in a complementary manner in response to the output signal of the preceding stage inverter. The current limiting element has a mutual conductance sized corresponding to a resistance component for delaying the output signal of a preceding stage inverter for a prescribed time period together with the above-described input capacitance component, and limits current flowing from the power supply node and the ground node to the first and second transistors. The feedback interconnection feeds back the signal of the output node to the input node.

In operation, the input capacitance component is determined by the sizes of the channels of the first and second transistors, the resistance component is determined by limiting current with the current limiting element, and therefore the input capacitance component and the resistance component for delaying the signal of a preceding stage inverter can independently be determined. Accordingly, if, for example, a ring oscillator having a short oscillation cycle of about 200 nsec can be made into a ring oscillator having a long cycle of about 7μsec such as a substrate potential generation circuit by limiting current. Furthermore, since the input capacitance component is small, charge/discharge current attributable to the input capacitance component is small, and power consumption is reduced as compared to a ring oscillator used in a conventional substrate potential generation circuit.

When the current limiting element is formed of third and fourth transistors and a current determining element coupled operatively to the control electrodes of third and fourth transistors, the ON resistance values of the third and fourth transistors can be controlled, and therefore an output signal having a prescribed cycle (cycle for substrate voltage) can be generated even with the gate lengths of the third and fourth transistors being reduced, thus reducing the area of the ring oscillator.

Furthermore, when first, third, fourth, and first transistors are serially connected in the order between the power supply node and the ground node, through current flowing from the power supply node to the ground node can further be reduced.

Briefly stated, the constant voltage generation circuit according to the invention includes a first ring oscillator, a first voltage generator, a level drop detector, a second ring oscillator, and a second voltage generator.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
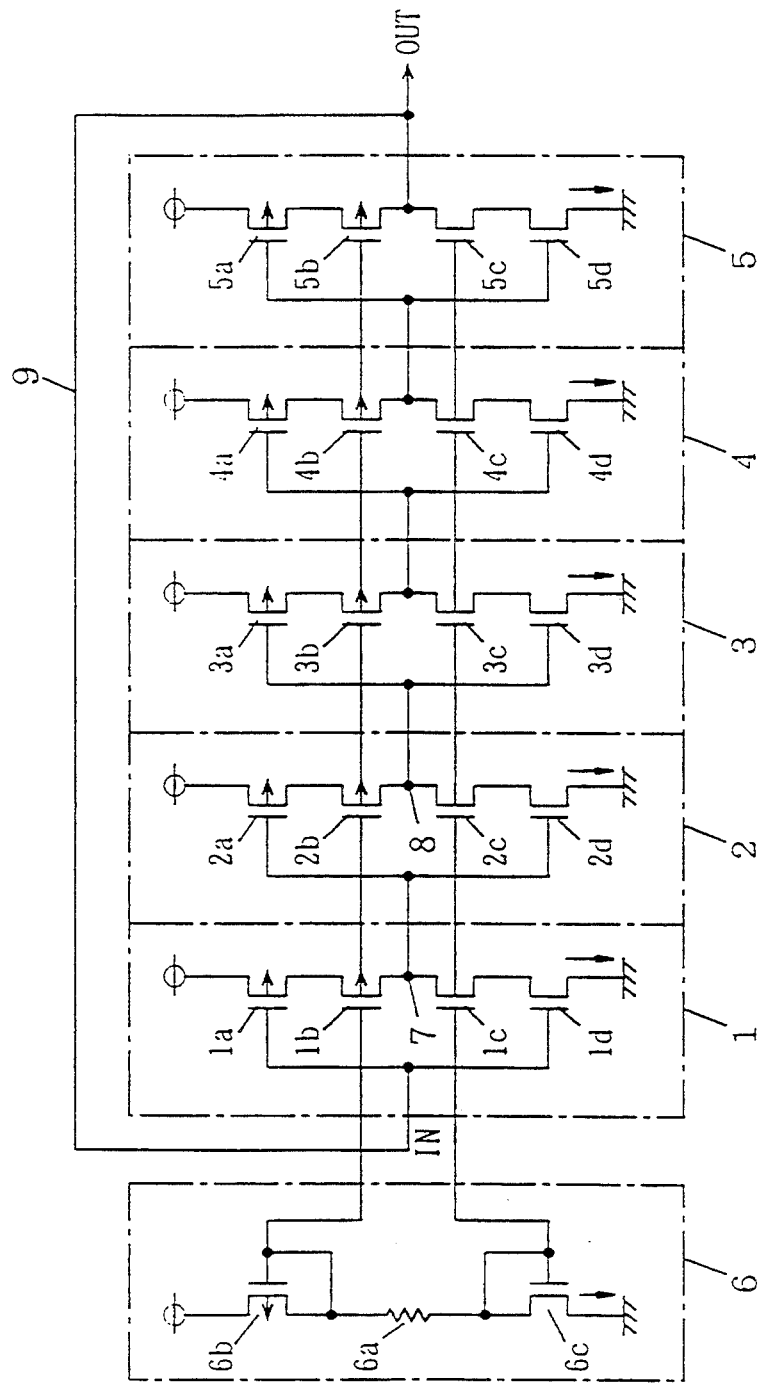
FIG. 1 is a circuit diagram showing one embodiment of a ring oscillator according to the invention.

FIG. 1 is a circuit diagram showing a ring oscillator according to one embodiment of the invention. Referring to FIG. 1, the ring oscillator includes inverters 1-5, and a circuit 6 constituting part of a current mirror circuit. Inverter 1 includes P channel transistors 1a and 1b, and N channel transistors 1c and 1d. P channel transistor 1a has its one electrode connected to a power supply node, the other electrode connected to one electrode of P channel transistor 1b, and its gate electrode connected together with the gate electrode of N channel transistor 1d to an input node IN. P channel transistor 1b has its the other electrode connected together with the other electrode of N channel transistor 1c to an output node 7, and its gate electrode connected to circuit 6 constituting part of the current mirror circuit. N channel transistor 1d has its one electrode connected to the ground node, and its the other electrode connected to one electrode of N channel transistor 1c. N channel transistor 1c has its control electrode connected to circuit 6 constituting part of current mirror circuit. The above-described P channel transistor 1b and circuit 6, and N channel transistor 1c and circuit 6 constitute a current mirror circuit. P channel transistor 1a and N channel transistor 1d constitute a switching circuit. Inverters 2, 3, 4, and 5 have the same structure as inverter 1.

Now, operation of the ring oscillator shown in FIG. 1 will be described. It is assumed that input signal IN rises from 0 volt to power supply voltage Vcc. When input signal IN rises from 0 volt to power supply voltage Vcc, N channel transistor 1d is turned on. When N channel transistor 1d is completely turned on, and the gate-source voltage $V_{GS}$ of N channel transistor 1c for limiting current is larger than a threshold voltage $V_{TH}$, N channel transistor 1c is turned on. In response, the voltage of node 7 decreases to GND, and the output of inverter 1 attains an "L" level. P channel transistor 2a among transistors 2a and 2d included in the second stage inverter receives the output of the "L" level and is turned on. When P channel transistor 2a is completely turned on and the gate-source voltage $V_{GS}$ of P channel transistor 2b for limiting current is smaller than threshold voltage $V_{TH}$, P channel transistor 1b is turned on and the voltage of node 8 rises to Vcc. In response, the output of inverter 2 attains an "H" level.

The output of inverter 3 similarly attains an "L" level, the output of inverter 4 attains an "H" level, and the output of inverter 5, in other words output signal OUT attains an "L" level. Output signal OUT is used for the next input signal IN and output signal OUT is inverted in a cycle corresponding to delay time for the five stages of inverters.

Herein, the five stages of inverters are used to constituting the ring oscillator by way of illustration, but odd number stages more than five may be employed.

Figure 2:
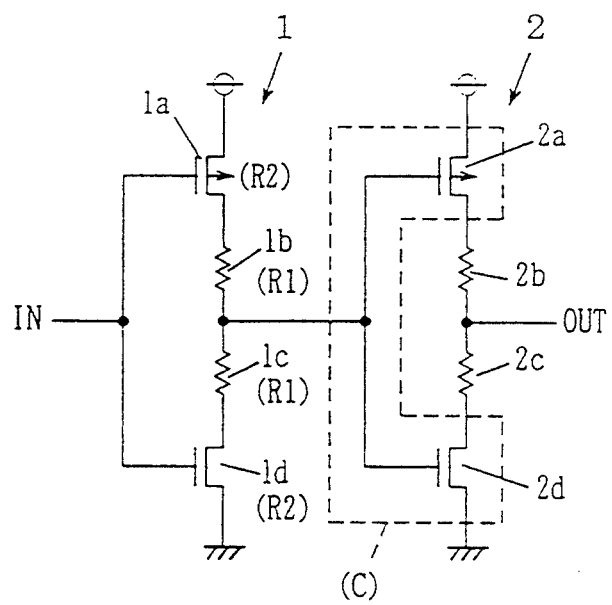
FIG. 2 is a circuit diagram for use in illustration of operation of one stage of inverter shown in FIG. 1.

FIG. 2 is a diagram for use in illustration of operation of one stage of inverter for the ring oscillator shown in FIG. 1.

Referring to FIG. 2, P channel transistor 1a and N channel transistor 1d each have an ON resistance value R2, and P channel transistor 1b and N channel transistor 1c each have an ON resistance value R1. Capacitance created by the gates of P channel transistor 2a and N channel transistor 2d is referred to as C. Under the above-described condition, a time delay for one stage of inverter is given as follows:

$$t \propto f \qquad (3)$$

As can be seen from expression (3), to decrease i can prolong the oscillation cycle with capacitance C corresponding to a reduced cycle, and consumption current can be reduced. The use of capacitance C corresponding to the reduced cycle means that the gate lengths and gate widths of P channel transistor 1a and N channel transistor 1d are small.

Figure 3:
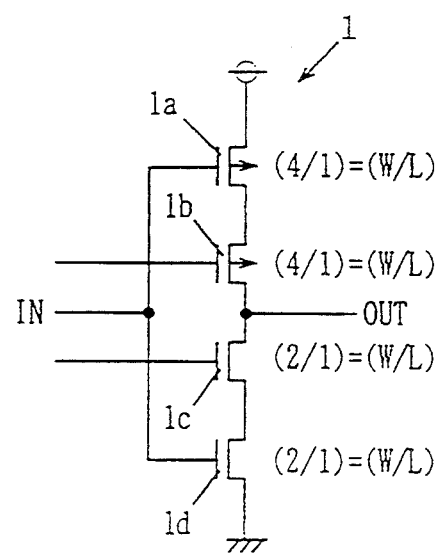
FIG. 3 is a circuit diagram showing a specific example for operating the inverter shown in FIG. 1 in a prescribed cycle and with prescribed consumption current.

FIG. 3 is a diagram showing the gate width/gate length of inverter 1 shown in FIG. 1. The relation between oscillation cycle and current consumption by the inverter shown in FIG. 3 is set forth in Table 1.

TABLE 1

| Cycle | Current Consumption |
| --- | --- |
| 200 ns | 7.84 μA |
| 6.2 μs | 0.57 μA |

As described above, the inverter includes transistors 1a and 1d for switching, and transistors 1b and 1c for current limiting whose current conductance is determined in relation to the sizes of transistors 1a and 1d for switching. Since these transistors 1a-1d are connected in series between the power supply node and the ground node, the W and L sizes (in other words capacitance C) of transistors constituting inverter 2 which is to be a succeeding stage load can be reduced, and therefore current by charge/discharge at gate electrode can be reduced. As a result, current consumption can be reduced.

Transistors 1b and 1c limiting current are formed of a current mirror circuit, current flowing across gate electrodes can be controlled by voltage from circuit 6 constituting part of the current mirror circuit without reducing W/L (without increasing the size of gate length L).

Furthermore, since the other electrodes of transistors 1b and 1c for limiting current (drain electrodes) are used as the output node of an inverter, transistors 1b and 1c for limiting current will not be turned on unless transistors 1a and 1d for switching are completely turned on. Accordingly, time for a leading edge and a trailing edge of a waveform can be reduced even in a long cycle (6.2μs), and therefore through current can be restrained.

Figure 4:
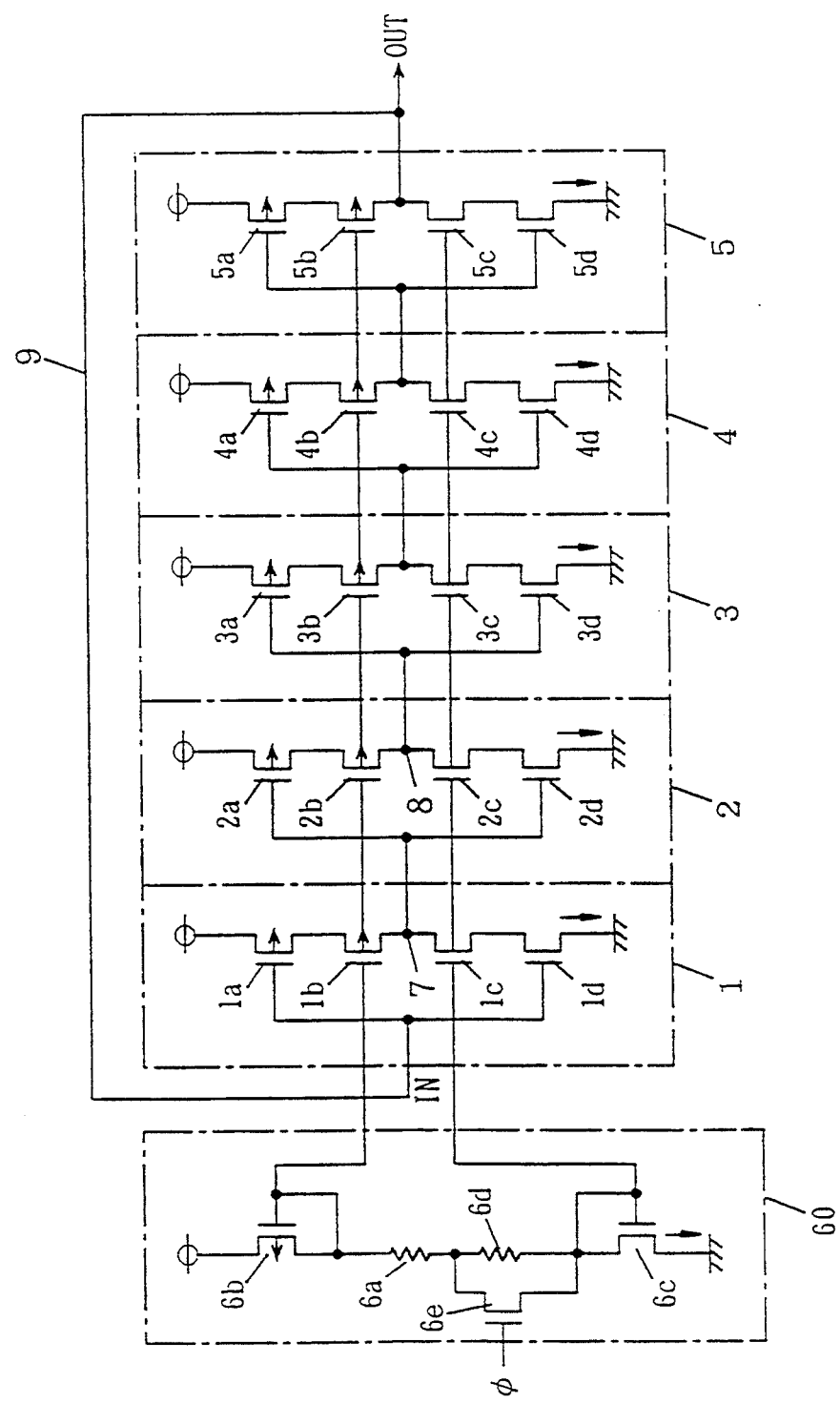
FIG. 4 is a circuit diagram showing a ring oscillator according to a second embodiment of the invention.

FIG. 4 is a circuit diagram showing another embodiment of the invention. The ring oscillator in FIG. 4 is different from the ring oscillator in FIG. 1 in that a resistor 6d and an NMOS transistor 6e are additionally provided between one end of resistor 6a and the drain electrode of NMOS transistor 6c. Resistor 6a has a resistance value Ra, and resistor 6d has a resistance value Rb.

Now, operation will be described. When an input signal φ attains an "H" level, N channel transistor 6e is turned on and the resistance value Ra of resistor 6a is reached. At the time, current i flowing through circuit 6 is $i_1 = V/Ra$. If input signal φ attains an "L" level, N channel transistor 6e is turned off, the composite value Ra+Rb of resistors 6a and 6d is obtained, and current I flowing through circuit 6 is $I_2 = V/(Ra+Rb)$. Thus, $i_1 > i_2$ holds, $T_1 < T_2$ is established for the cycle, because $i = C \cdot V/T$.

More specifically, increase of the resistance decreases the current and prolongs the cycle, and therefore the cycle of the ring oscillator can be changed by selecting the values for the resistors in circuit 6 in response to input signal $\phi$.

Note that although in the embodiment shown in FIG. 4, N channel transistor 6e is used as a switch for selecting a resistance value, a P channel transistor controlled by an input signal $\phi$ may be used.

Figure 5:
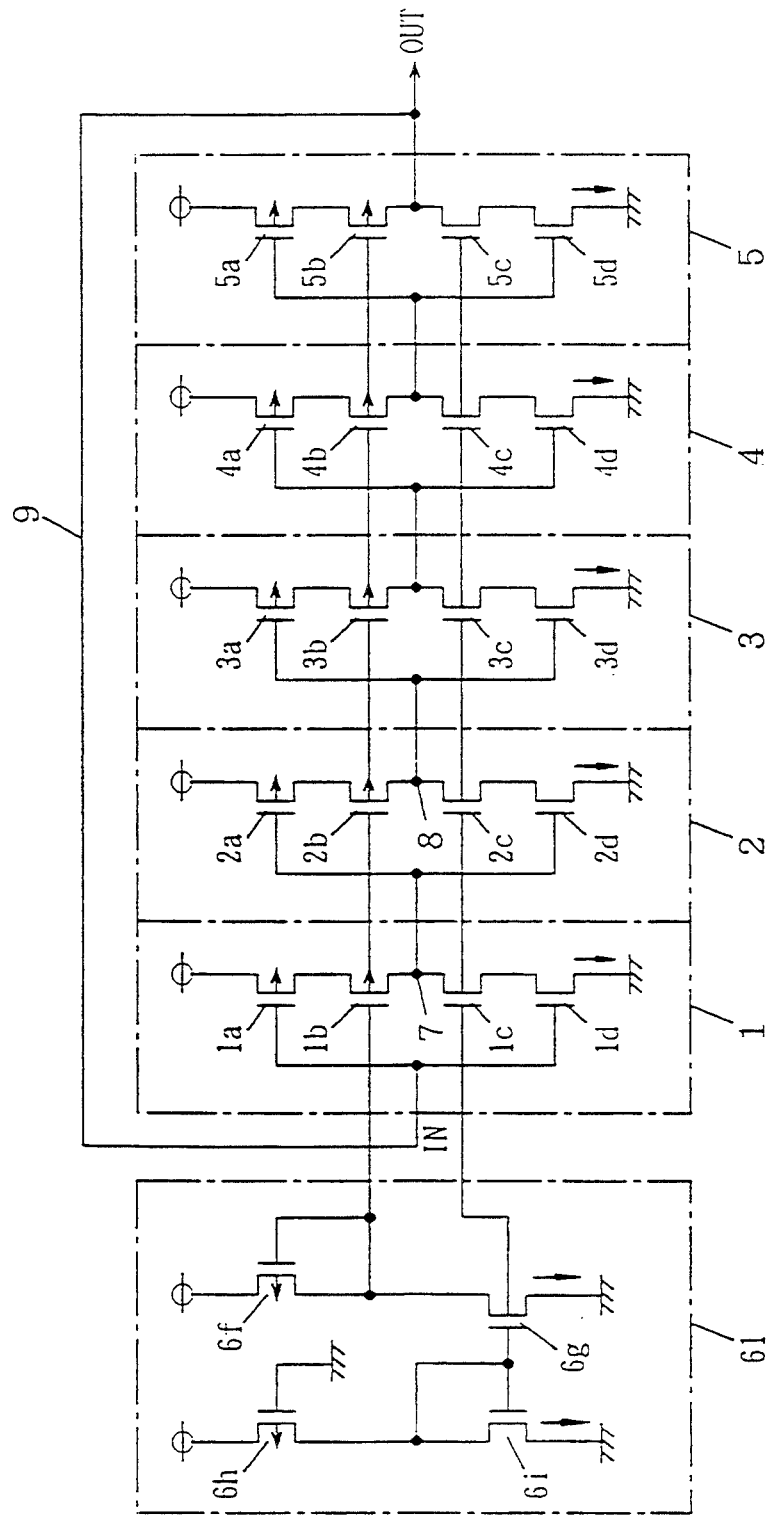
FIG. 5 is a circuit diagram showing a ring oscillator according to a third embodiment of the invention.

FIG. 5 is a circuit diagram showing another embodiment of the invention. The ring oscillator shown in FIG. 5 is different from the ring oscillator shown in FIG. 1 in that the circuit constituting part of the current mirror circuit is formed of P channel transistors 6h and 6f and N channel transistors 6d and 6i. The structure of the other circuit portions is the same as the circuit shown in FIG. 1.

Circuit 6 shown in FIG. 1 decreases from power supply voltage Vcc by 2 $V_{TH}$ to attain an operation state. In contrast, circuit 61 shown in FIG. 5 decreases by a $V_{TH}$ from power supply voltage Vcc to attain an operation state, and therefore a wide range for operation can be secured as compared to the first embodiment.

Figure 6:
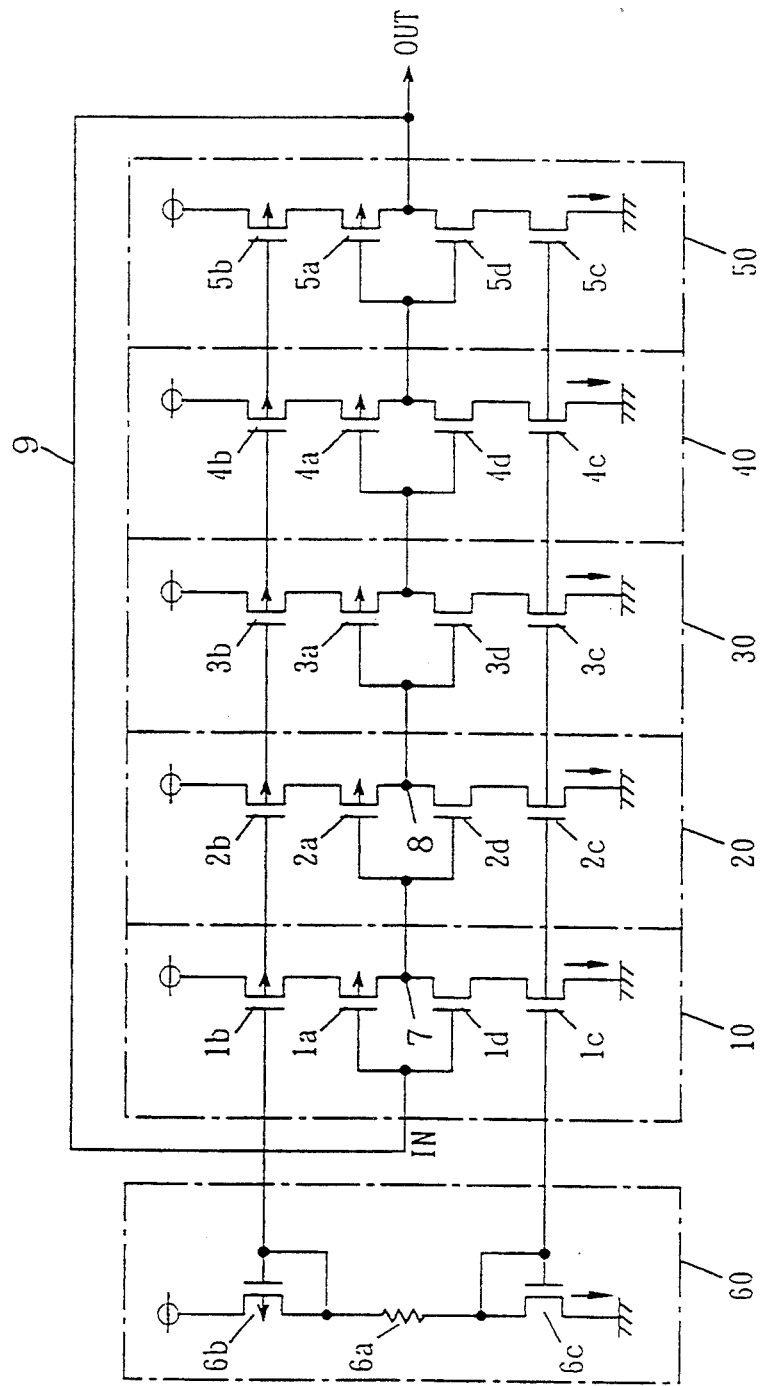
FIG. 6 is a circuit diagram showing a ring oscillator according to a fourth embodiment of the invention.

FIG. 6 is a circuit diagram showing a ring oscillator according to another embodiment of the invention. In the oscillator shown in FIG. 1, the drain side of transistors 1b and 1c for limiting current is connected to the output of the next stage, but in the ring oscillator shown in FIG. 6, the drain side of transistors 1a and 1d constituting the switching circuit is connected to the output of the next stage. Note that in FIG. 6 the drains of transistors 1a and 1d constituting a switching circuit function as a node 7 which is an output to the next stage.

Figure 7:
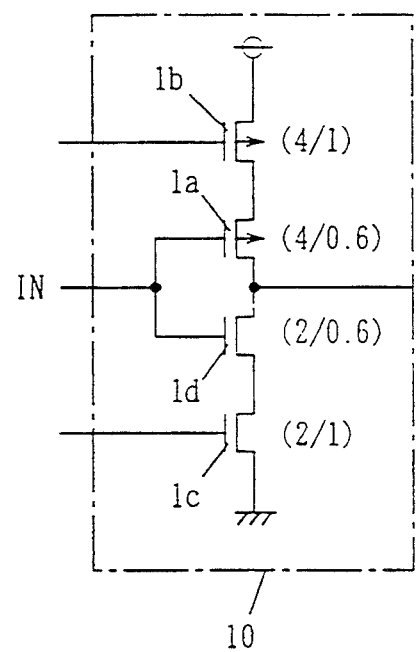
FIG. 7 is a circuit diagram showing a specific example for operating the ring oscillator shown in FIG. 6 in a prescribed cycle and with a prescribed current consumption.

FIG. 7 is a diagram showing a specific example of gate width/gate length when the ring oscillator shown in FIG. 6 is operated in an oscillation cycle; 200 ns, with a current consumption; 9.55μA.

Figure 8:
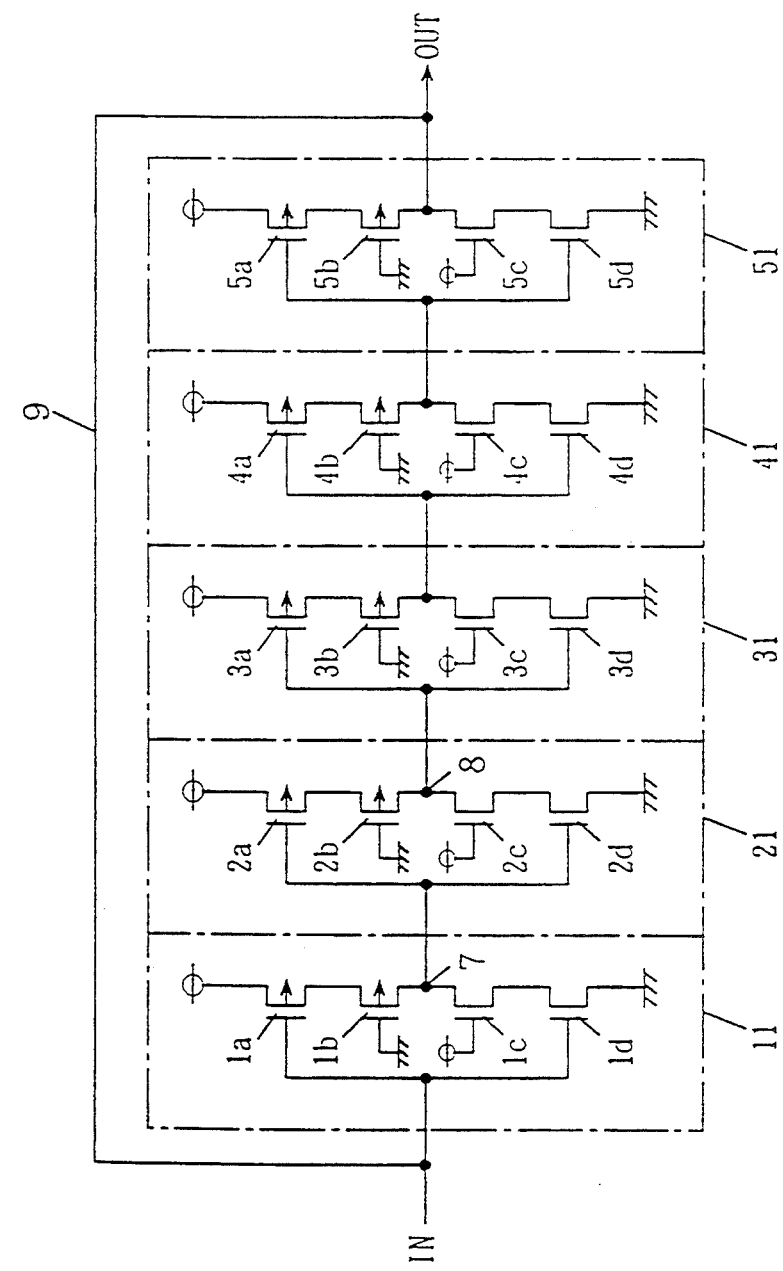
FIG. 8 is a circuit diagram showing a ring oscillator according to a fifth embodiment of the invention.

FIG. 8 is a circuit diagram showing a ring oscillator according to yet another embodiment of the invention. In the ring oscillators shown in FIGS. 1, 4, 5, and 6, transistors 1b and 1c for limiting current are formed of a current mirror circuit, but in the ring oscillator shown in FIG. 8, the gate electrode of P channel transistor 1b is connected to GND, while the gate electrode of N channel transistors 1c is connected to power supply potential Vcc, so that constant resistance is always generated. Second to fifth stage inverters 21, 31, 41, and 51 have the same configuration as that of first stage inverter 11.

Figure 9:
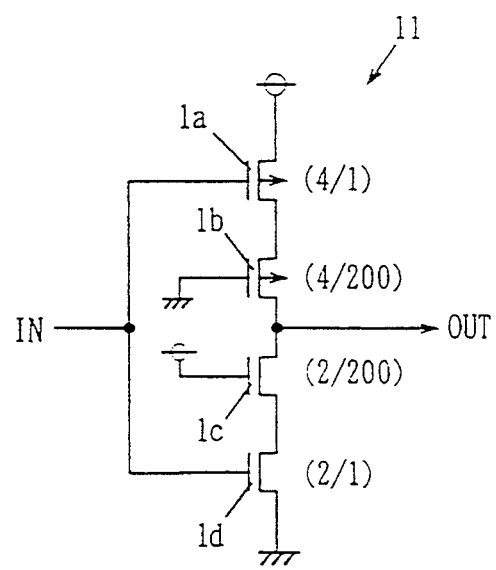
FIG. 9 is a circuit diagram showing a specific example for operating the inverter in FIG. 8 in a prescribed cycle and with a prescribed current consumption.

FIG. 9 is a view showing a specific example of gate width/gate length for each of transistors 1a–1d in the first stage of the ring oscillator shown in FIG. 8. In the inverter shown in FIG. 9, the W/L's of transistors 1b and 1c for limiting current are 4/200 and 2/200, respectively, and considerably large compared to the first to fourth embodiments. The ratios of gate width/gate length of switching circuits 1a and 1d are the same as the first to fourth embodiments. More specifically, in the fifth embodiment, the amount of current consumption can be reduced without changing the size of the switching circuit. For the size of each of transistor shown in FIG. 9, charge/discharge current is minimized in a cycle of 7.6μsec.

Figure 10:
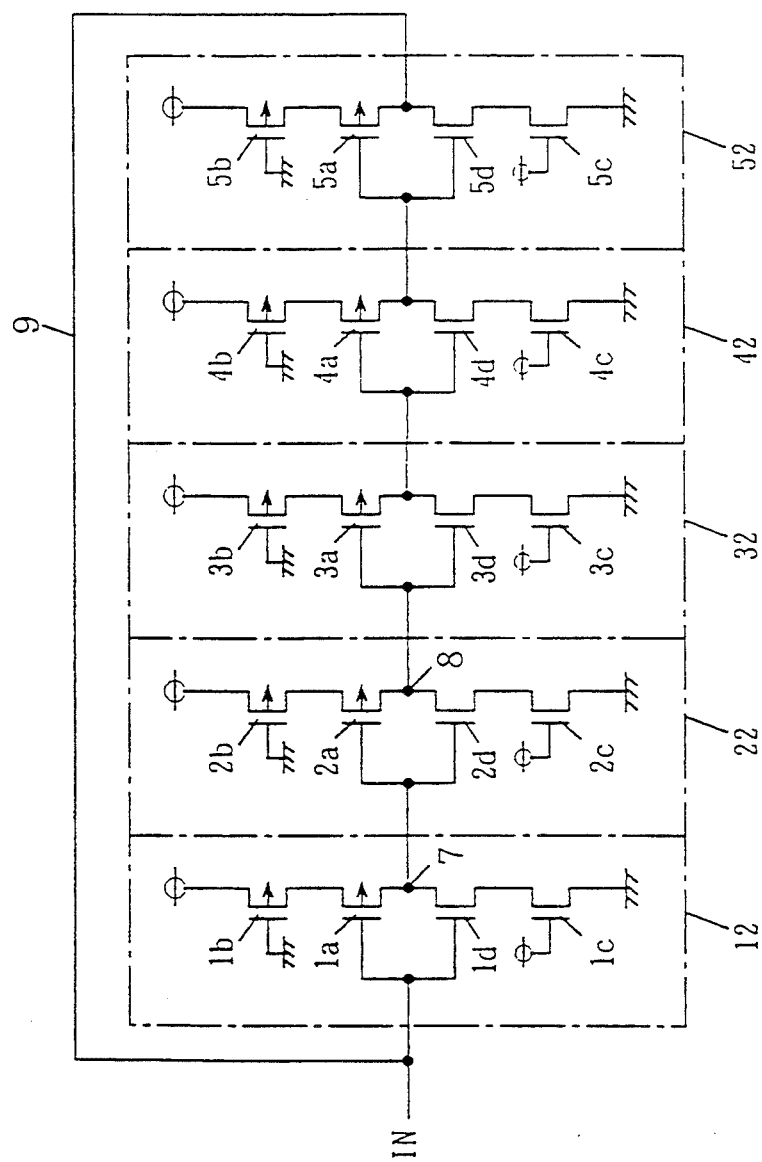
FIG. 10 is a circuit diagram showing a ring oscillator according to a sixth embodiment of the invention.

FIG. 10 is a circuit diagram showing a ring oscillator according to yet another embodiment of the invention.

The ring oscillator shown in FIG. 10 is different from the ring oscillator shown in FIG. 8 in that instead of connecting P channel transistors 1a, 1b, N channel transistors 1c, 1d in series between power supply node Vcc and ground node, P channel transistor 1b, P channel transistor 1a, N channel transistor 1b, and N channel transistor 1c are connected in the order between power supply node Vcc and ground node.

In operation, the ring oscillator shown in FIG. 10 cannot restrain through current as opposed to the inverter shown in FIG. 8, but performs the same operation as the ring oscillator shown in FIG. 8 for the other functions.

Figure 11:
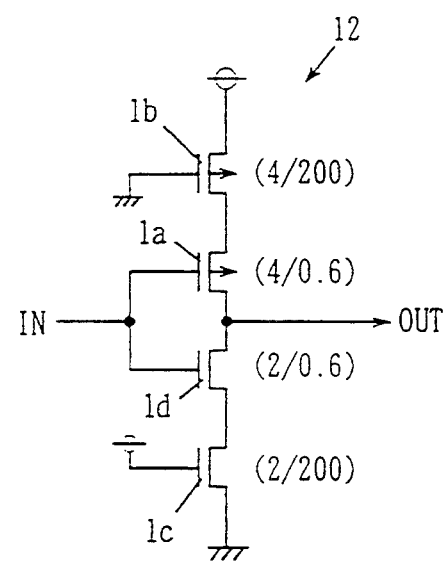
FIG. 11 is a circuit diagram showing a specific example for operating the inverter shown in FIG. 10 in a prescribed cycle and with a prescribed current consumption.

FIG. 11 is a diagram showing a specific example of the gate width/gate length of inverter 12 shown in FIG. 10.

As illustrated in FIG. 11, prolonging the gate lengths of transistors 1b and 1c for limiting current increases the resistance value between the drain electrodes of transistors 1a and 1d for switching, and therefore it will not be necessary to control transistors 1b and 1d for limiting current with the externally provided circuit 6 as in the first embodiment.

Figure 12:
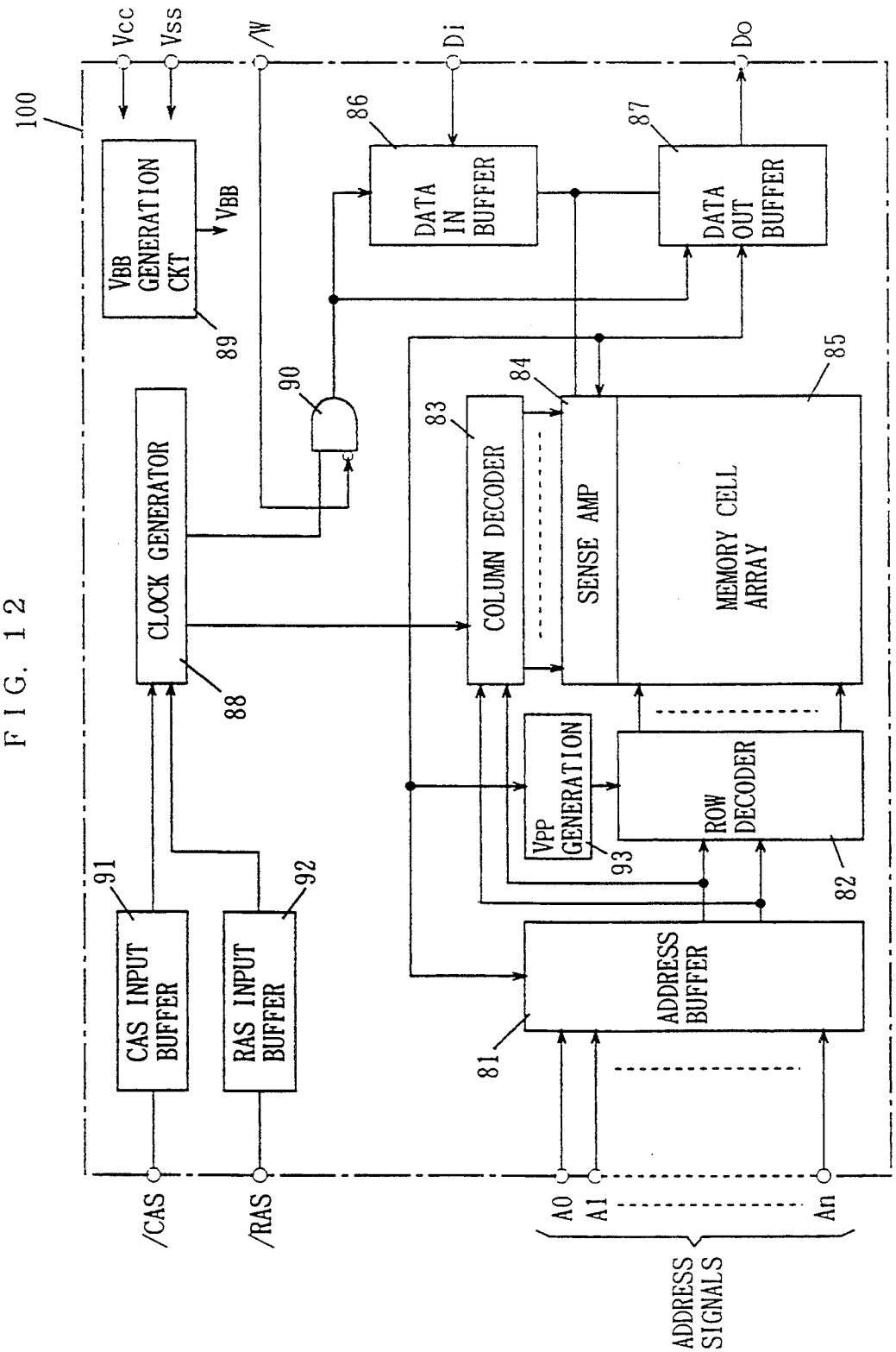
FIG. 12 is a block diagram showing a DRAM including a VBB generation circuit and a Vpp generation circuit.

FIG. 12 is a block diagram showing a DRAM including a VBB generation circuit and a Vpp generation circuit.

Referring to FIG. 12, DRAM 100 includes a memory cell array 85 including a number of memory cells, an address buffer 81 receiving externally applied address signals A0 to An, a row decoder 82 and a column decoder 83 for addressing a row and a column in memory cell array 85 in response to a received address signal, and a sense amplifier 84 for amplifying a data signal read out from a memory cell. Input data Di is applied through a data in buffer 86. Output data Do is output through a data out buffer 87. DRAM 100 includes a clock signal generator 83 for generating a clock signal to control various circuits provided therein. DRAM 100 includes a VBB generation circuit 89 for generating a substrate bias voltage VBB, and a Vpp generation circuit 93 for generating voltage Vpp higher than power supply voltage Vcc when a word line is activated.

Figure 13:
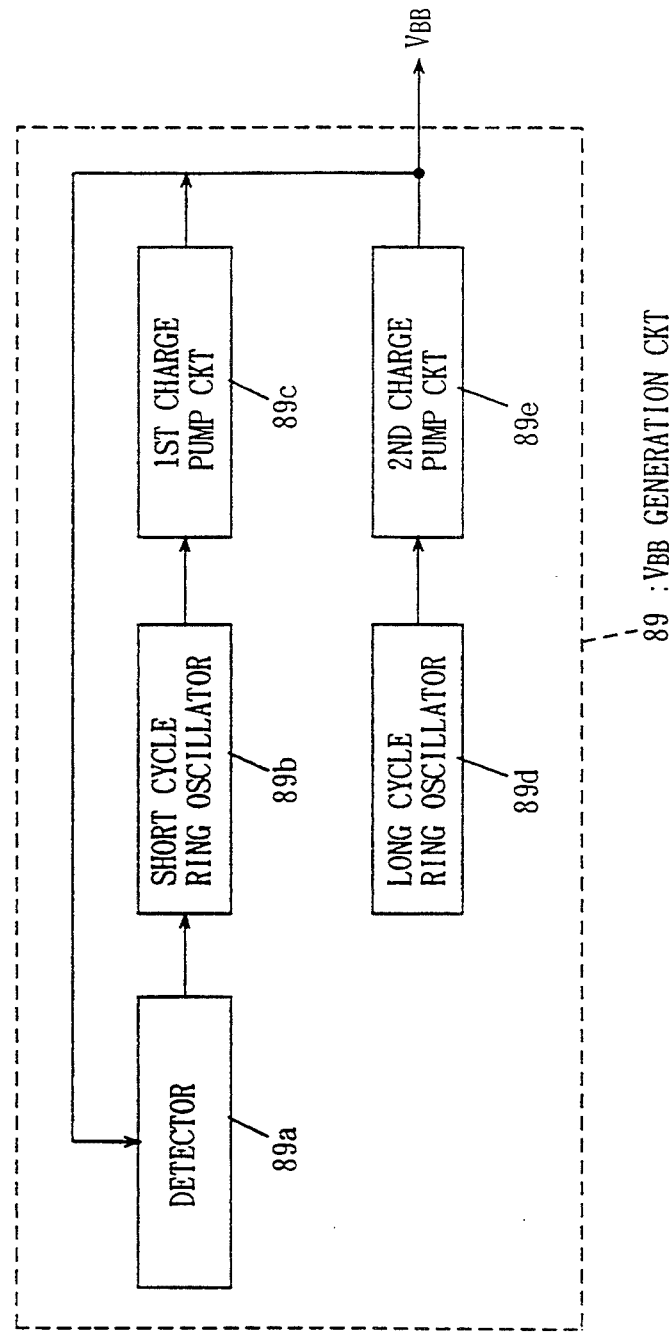
FIG. 13 is a block diagram showing the VBB generation circuit shown in FIG. 12.

FIG. 13 is a block diagram showing VBB generation circuit 89. VBB generation circuit 89 includes a detector 89a, a short cycle ring oscillator 89b, a first charge pump circuit 89c, a long cycle ring oscillator 89d and a second charge pump circuit 89e. Detector 89a detects the output voltage of second charge pump circuit 89e decreasing below fixed voltage VBB (−2 V), and activates short cycle ring oscillator 89b. Short cycle ring oscillator 89b cascade-connects unit inverters 15–35 each including two switching transistors 1p and 1n. First charge pump circuit 89c responds to the output of short cycle ring oscillator 89p and generates voltage for biasing the substrate terminal to a negative voltage (−3 V) so that a transistor included in a memory cell is not activated.

Long cycle ring oscillator 89d cascade-connects inverters illustrated in the above-described first to sixth embodiments, and always oscillates in a fixed cycle. Short cycle ring oscillator 89b oscillates in a cycle of 200 ns, for example, while long cycle ring oscillator 89d has an oscillation cycle of 7.6μs.

Second charge pump circuit 89e responds to the output of long cycle ring oscillator 89d and generates voltage for biasing the substrate terminal to a negative potential (−3 V) as in the case of second charge pump circuit 89c. The output node of second charge pump circuit 89e is connected together with the output node of first charge pump circuit 89c to the substrate terminal and detector 89a.

Figure 18:
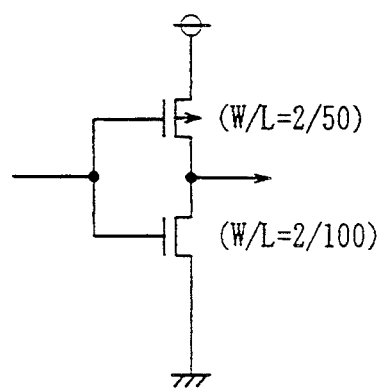
FIG. 18 is a circuit diagram showing a specific example for operating the ring oscillator shown in FIG. 15 for 7.6μs, and 1.91μA.
Figure 19:
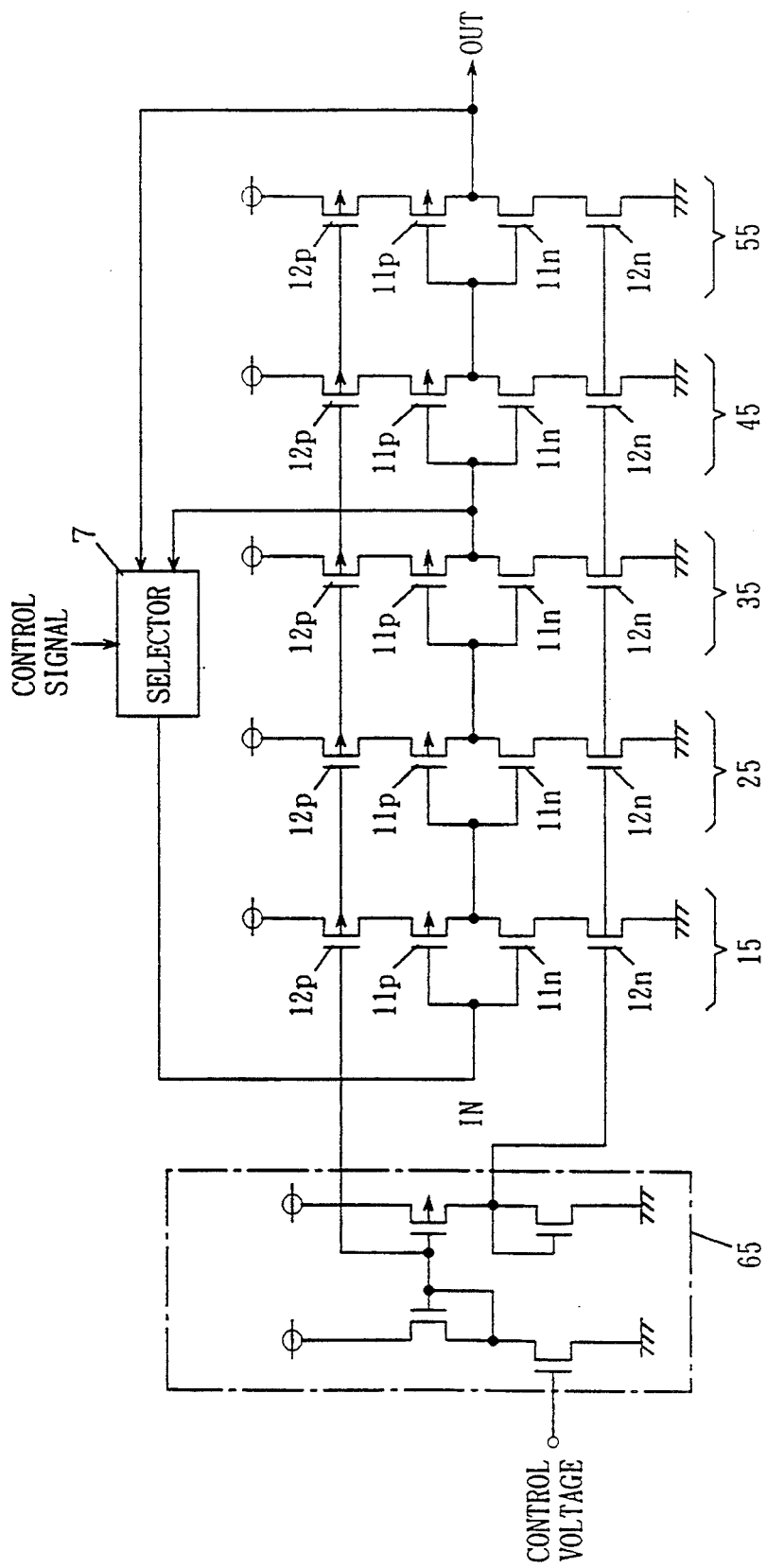
FIG. 19 is a circuit diagram showing another example of a conventional ring oscillator.
Figure 20:
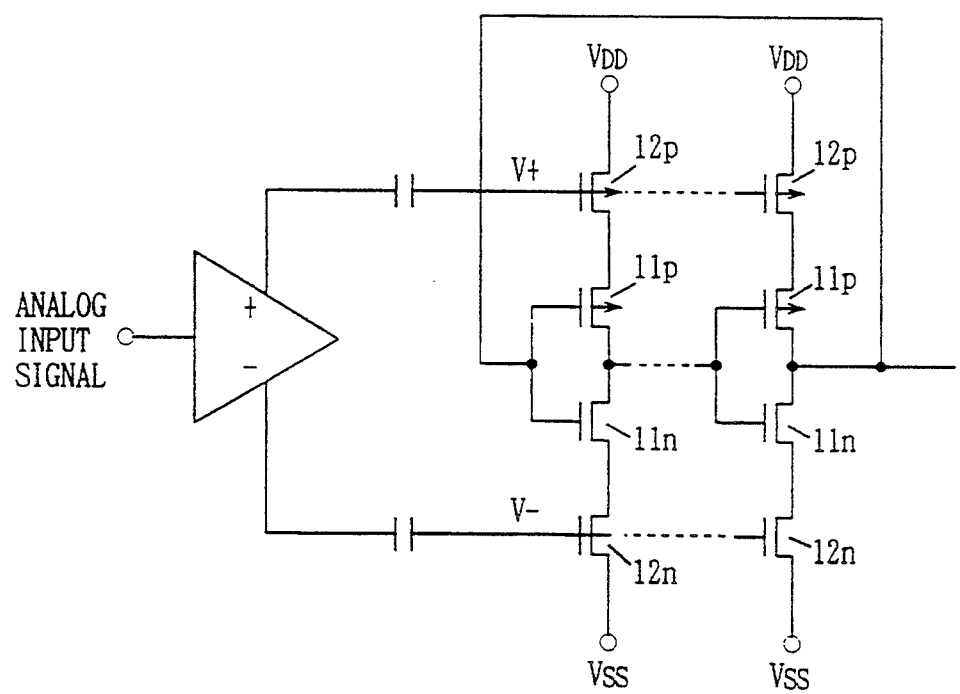
FIG. 20 is a circuit diagram showing yet another example of a conventional ring oscillator.

In operation, long cycle ring oscillator 89d is always activated. Second charge pump circuit 89e responds to the output of long cycle ring oscillator 89d and generates substrate bias voltage VBB. The oscillation cycle of long cycle ring oscillator 89d is set longer than the cycle of short cycle ring oscillator 89b, current consumption is reduced. Furthermore, since the structure shown in the first to sixth .embodiments is implemented, current consumption is further reduced from the conventional long cycle ring oscillator (FIG. 18).

As in the foregoing, the VBB generation circuit shown in FIG. 13 can greatly reduce power consumption and therefore very much effective when used for generating backup voltage for a DRAM device.

Figure 14:
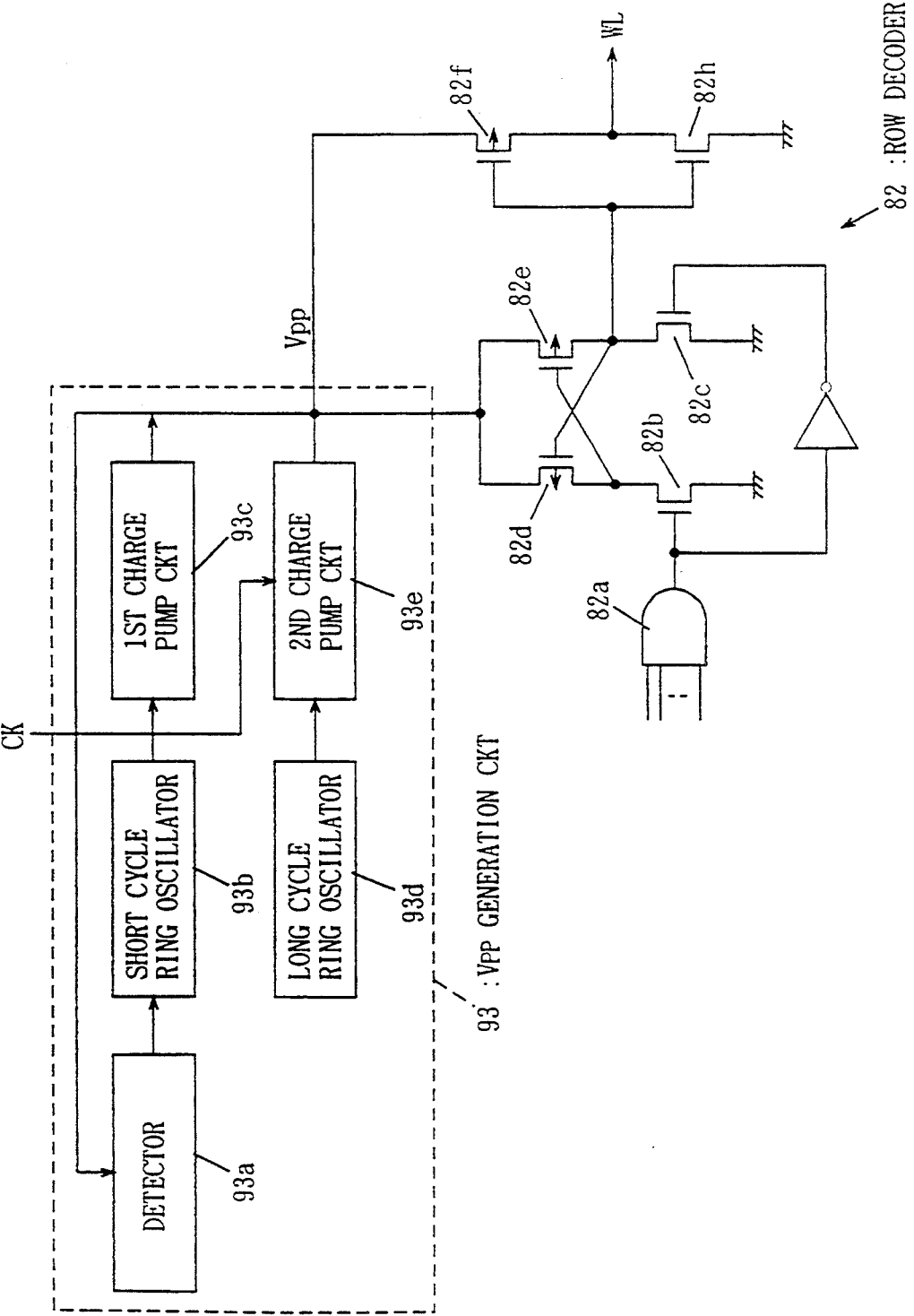
FIG. 14 is a block diagram showing the Vpp generation circuit shown in FIG. 12.
Figure 15:
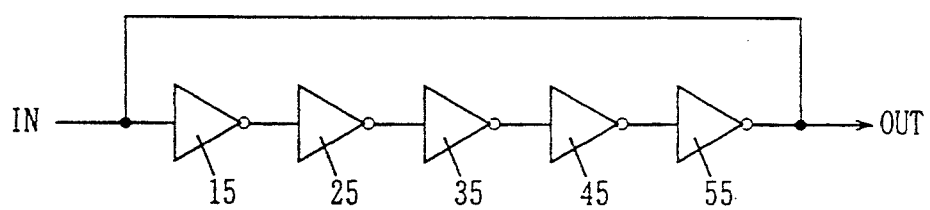
FIG. 15 is a circuit diagram showing a conventional ring oscillator.
Figure 16:
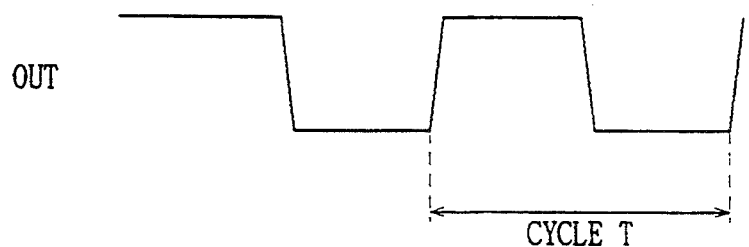
FIG. 16 is a waveform chart showing the output of the ring oscillator shown in FIG. 15.
Figure 17A:
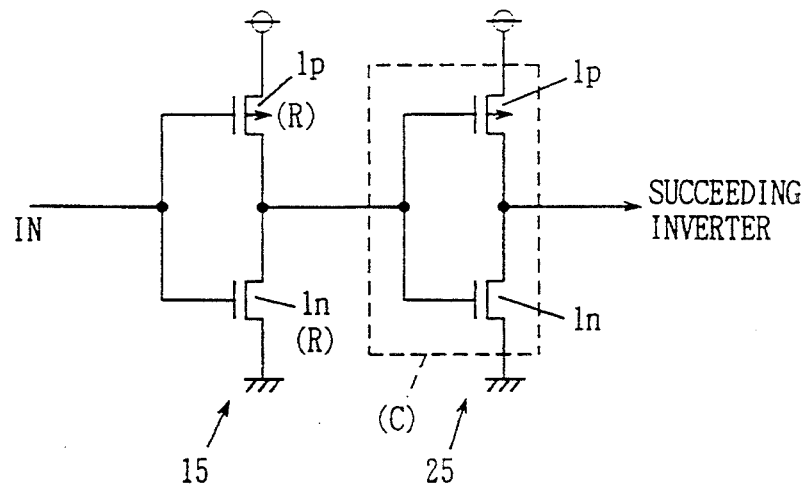
FIG. 17A is a circuit diagram showing in detail first stage inverter 15 and second stage inverter 25 shown in FIG. 15.
Figure 17B:
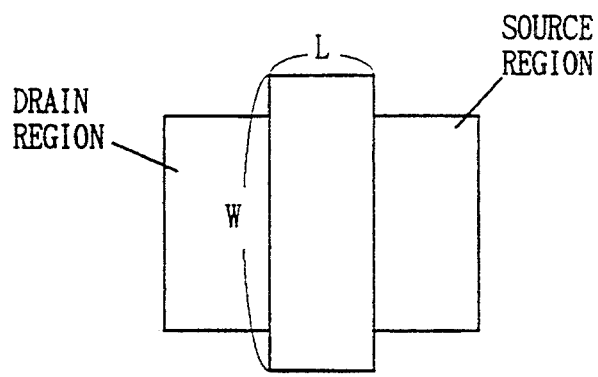
FIG. 17B is a plan view showing a transistor constituting each inverter shown in FIG. 17A.

FIG. 14 is a block diagram showing Vpp generation circuit 93 shown in FIG. 12. Vpp generation circuit 93 as in the case of VBB generation circuit 89 shown in FIG. 13 includes a detector 93a, a short cycle ring oscillator 93b, a first charge pump circuit 93c, a long cycle ring oscillator 93d, and a second charge pump circuit 93e. The Vpp generation circuit is different from the VBB generation circuit in that first and second charge pump circuits 93c and 93e generate positive voltage Vpp. The positive voltage Vpp is voltage for setting a word line WL to a slightly higher potential (5.8 V, for example) than power supply voltage Vcc during a writing cycle period. A row decoder 82 includes a multi-input NAND circuit 82a, PMOS transistors 82d, 82e, and 82f, and NMOS transistors 82b, 82c, and 82h. Row decoder 82 decodes a row address signal, and supplies constant potential Vpp generated from Vpp generation circuit 93 to word line WL.

In operation, an output signal in a long cycle is generated by long cycle ring oscillator 93d, and in response to the long cycle output signal, second charge pump circuit 93e generates positive voltage Vpp. When voltage Vpp decreases, detector 93a detects the decrease of voltage Vpp, and activates short cycle ring oscillator 93b. Thus, voltage generated by first charge pump circuit 93 is added to voltage Vpp generated by second charge pump circuit 93e, and the potential of word line WL rises.

As in the foregoing, the use of Vpp generation circuit 93 shown in FIG. 14 provides a constant voltage generation circuit with a reduced power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. Constant voltage generation circuit, comprising:
a first ring oscillator including a plurality of cascade-connected first inverters for generating a first signal in a first cycle;
first voltage generation means responsive to the first signal in the first cycle generated by said first ring oscillator for generating a first voltage;
detection means for detecting an amount by which an absolute magnitude of the first voltage is less than a prescribed absolute magnitude and generating a detection signal;
a second ring oscillator including a plurality of cascade-connected second inverters and responsive to the detection signal received from said detection means, for generating a second signal in a second cycle shorter than said first cycle by feeding back the output of a final stage inverter to a second stage inverter, each of said second inverters including (i) first and second transistors each having a channel sized to delay an output signal of a preceding stage inverter for a first time period corresponding to said second cycle and being turned on/off in a complementary manner in response to the output signal of said preceding stage inverter, and (ii) current limiting means having a mutual conductance whose size is selected corresponding to a resistance component for achieving said first time delay together with said input capacitance component for limiting current flowing from the power supply node and the ground node to said first and second transistors; and
second voltage generating means responsive to the second signal in the second cycle generated by said second ring oscillator for generating a second voltage.

2. Constant voltage generation circuit as recited in claim 1, wherein each said second inverter includes first and second transistors each channel of which is sized so as to have an input capacitance component and a resistance component for delaying the output signal of a preceding stage inverter for a second time period corresponding to said second cycle.

3. Constant voltage generation circuit as recited in claim 2, wherein
said first and second voltages are provided to a semiconductor substrate as a substrate bias voltage.

4. Constant voltage generation circuit as recited in claim 2, wherein
said constant voltage generation circuit is provided in as a semiconductor memory device, and said first and second voltages are provided to a word line driver circuit.

5. Constant voltage generation circuit, comprising:
a first ring oscillator including a plurality of cascade-connected first inverters for generating a first signal in a first cycle;
first voltage generation means responsive to the first signal in the first cycle generated by said first ring oscillator for generating a first voltage;
detection means for detecting an amount by which an absolute magnitude of the first voltage is less than a prescribed absolute magnitude and generating a detection signal;
a second ring oscillator including a plurality of cascade-connected second inverters and responsive to the detection signal received from said detection means, for generating a second signal in a second cycle shorter than said first cycle by feeding back an output of a final stage inverter to a first stage inverter, each of said second inverters including (i) first and second transistors each having a channel sized to delaying an output signal of a preceding stage inverter for a first time period corresponding to said first cycle, and being turned on/off in a complementary manner in response to the output signal of said preceding stage inverter, (ii) a third transistor having an ON resistance value corresponding to a resistance component for achieving a first time delay together with said input capacitance component for limiting current flowing from a power supply node to said first transistor, and (iii) a fourth transistor having an ON resistance value corresponding to said resistance component for limiting current flowing from said second transistor to the ground node; and second voltage generating means responsive to the second signal in the second cycle generated by said second ring oscillator for generating a second voltage.

* * * * *